(12) United States Patent
Lee et al.

(10) Patent No.: US 9,276,132 B2
(45) Date of Patent: Mar. 1, 2016

(54) NONVOLATILE MEMORY DEVICE AND METHOD FOR FABRICATING THE SAME

(71) Applicant: SAMSUNG ELECTRONICS CO., LTD., Suwon-si, Gyeonggi-do (KR)

(72) Inventors: Woo-Sung Lee, Yongin-si (KR); Kyong-Won An, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 221 days.

(21) Appl. No.: 13/969,912

(22) Filed: Aug. 19, 2013

(65) Prior Publication Data

US 2014/0084358 A1    Mar. 27, 2014

(30) Foreign Application Priority Data

Sep. 27, 2012    (KR) .................. 10-2012-0108114

(51) Int. Cl.
*H01L 29/792*    (2006.01)
*H01L 29/66*    (2006.01)
*H01L 27/115*    (2006.01)

(52) U.S. Cl.
CPC ........ *H01L 29/792* (2013.01); *H01L 27/11582* (2013.01); *H01L 29/66833* (2013.01); *H01L 29/7926* (2013.01)

(58) Field of Classification Search
CPC .................. H01L 27/11582; H01L 29/66833; H01L 29/792; H01L 29/7926
See application file for complete search history.

(56) References Cited

U.S. PATENT DOCUMENTS

| | | | |
|---|---|---|---|
| 2010/0244119 A1 | 9/2010 | Fukuzumi et al. | |
| 2011/0073866 A1 | 3/2011 | Kim et al. | |
| 2011/0280076 A1 | 11/2011 | Samachisa et al. | |
| 2011/0298013 A1 | 12/2011 | Hwang et al. | |
| 2011/0309430 A1 | 12/2011 | Purayath et al. | |
| 2012/0001247 A1 | 1/2012 | Alsmeier | |
| 2012/0049268 A1 | 3/2012 | Chang et al. | |
| 2012/0058629 A1* | 3/2012 | You .................. | H01L 27/11582 438/479 |
| 2012/0098050 A1 | 4/2012 | Shim et al. | |

* cited by examiner

*Primary Examiner* — Whitney T Moore
*Assistant Examiner* — Joseph Galvin, III
(74) *Attorney, Agent, or Firm* — Lee & Morse, P.C.

(57) ABSTRACT

A nonvolatile memory device includes an insulating pattern extending in a first direction, a conductive pattern on the insulating pattern, and an electrode structure extending in the first direction. The electrode structure is adjacent the insulating pattern and conductive pattern, and includes an alternating pattern of gate electrodes and interlayer insulating films. A protection film adjacent a side surface of the electrode structure has a shorter length in the first direction than a length of the electrode structure.

13 Claims, 21 Drawing Sheets

Fig. 2
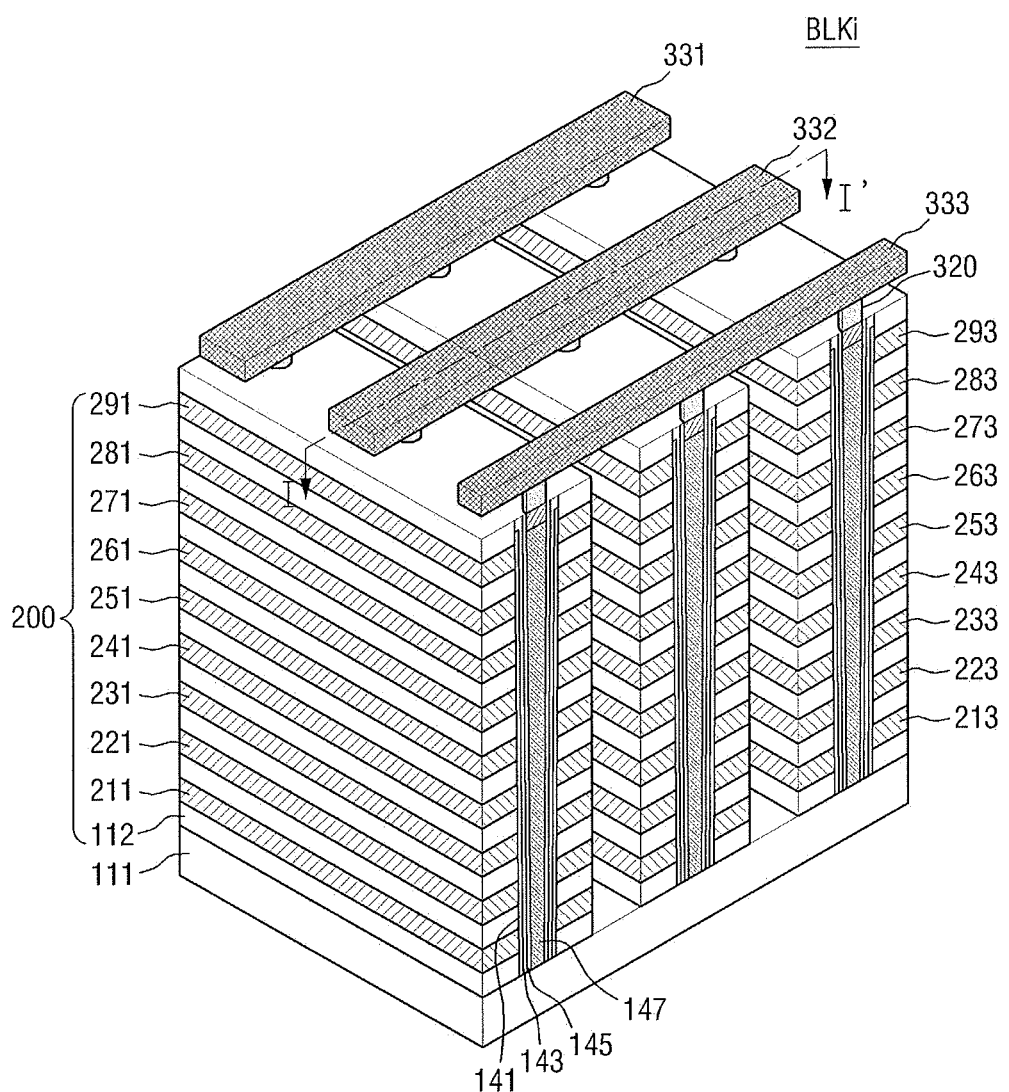
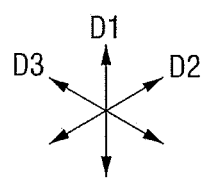

ic pattern and at least a portion of the conductive pattern; and a channel film between the charge storage film and the region that includes the insulating pattern and the conductive pattern.

NONVOLATILE MEMORY DEVICE AND METHOD FOR FABRICATING THE SAME

CROSS-REFERENCE TO RELATED APPLICATION

Korean Patent Application No. 10-2012-0108114, filed on Sep. 27, 2012, and entitled: "Nonvolatile Memory Device and Method for Fabricating the Same," is incorporated by reference herein in its entirety.

BACKGROUND

1. Field

One or more embodiments herein relate to a nonvolatile memory device.

2. Description of the Related Art

Semiconductor memory devices are storage devices implemented using a semiconductor material such as silicon (Si), germanium (Ge), gallium arsenide (GaAs), and indium phosphide (InP).

Memory devices of this type may be classified as volatile or nonvolatile. In a volatile memory device, data is lost when power is turned off. Examples of this kind of device include an SRAM (Static RAM), a DRAM (Dynamic RAM), and a SDRAM (Synchronous DRAM). In a nonvolatile memory device, data is retained when power is turned off. Examples of this kind of device include a flash memory device, a ROM (Read Only Memory), a PROM (Programmable ROM), an EPROM (Electrically Programmable ROM), an EEPROM (Electrically Erasable and Programmable ROM), and a resistive memory (for example, a PRAM (Phase-change RAM), a FRAM (Ferroelectric RAM), and a RRAM (Resistive RAM)).

In order to satisfy performance and price requirements, many consumer products use nonvolatile memory devices. However, these devices have drawbacks. For example, conventional nonvolatile devices have a two-dimensional or plane-type configuration which is limited in terms of storage capacity and, more particularly, the number of memory cells that exist per unit area. To overcome these drawbacks, three-dimensional memory devices have been proposed. However, the initial designs of these devices have proven to be inadequate in a number of respects.

SUMMARY

Embodiments are directed to a nonvolatile memory device having a three-dimensional array of electrode structures, at least one of which is equipped with a protective layer.

In accordance with one embodiment, a nonvolatile memory device includes a substrate; an insulating pattern extending in a first direction on the substrate; a conductive pattern on the insulating pattern; an electrode structure including an alternating pattern of gate electrodes and interlayer insulating films extending in the first direction, the electrode structure adjacent the insulating pattern and the conductive pattern; and a protection film adjacent a side surface of the electrode structure, wherein a length of the protection film in the first direction is shorter than a length of the electrode structure in the first direction.

Also, the length of the protection film in the first direction may be longer than a length between an upper surface of the substrate and an upper surface of an uppermost gate electrode of the plurality of gate electrodes.

Also, the device may include a charge storage film between the protection film and a region that includes the insulating pattern and at least a portion of the conductive pattern; and a channel film between the charge storage film and the region that includes the insulating pattern and the conductive pattern.

Also, the charge storage film may include a blocking insulating film on a side surface of the protection film; a tunnel film on a side surface of the channel film; and a trapping film between the blocking insulating film and the tunnel film. The charge storage film may overlap an upper surface of the protection film.

Also, the charge storage film may at least substantially conforms to the side surface of the electrode structure, an upper surface of the protection film, and a side surface of the protection film. The channel film may conform to a side surface of the charge storage film. W width of the conductive pattern may be greater than a width of the insulating pattern.

In accordance with another embodiment, a method for fabricating a nonvolatile memory device includes providing a substrate with an electrode structure that includes an alternating pattern of gate electrodes and interlayer insulating films in a first direction; forming a recess inside the electrode structure; forming a protection film to conform to a side surface of the electrode structure; exposing a portion of the protection film by forming an etching prevention film with a height higher than a height of an upper surface of the electrode structure; and removing the exposed protection film. The etching prevention film may be a SOH (Spin On Hardmask).

Also, the upper surface of the etching prevention film may be higher than an upper surface of the first gate electrode that is disposed on an uppermost layer of the plurality of gate electrodes.

Also, the method may include removing the etching prevention film after removing the exposed protection film; and forming a charge storage film in the recess so that an upper surface of the protection film is not exposed.

Also, forming the charge storage film may include forming the charge storage film to conform to a side surface of the electrode structure, the upper surface of the protection film, and a side surface of the protection film.

Also, the method may include forming a channel film to at least partially cover a side surface of the charge storage film after forming the charge storage film. Forming the channel film may include forming the channel film to conform to the side surface of the charge storage film.

In accordance with another embodiment, a semiconductor device includes an electrode structure; an insulating pattern extending through the electrode structure; a charge storage film between the electrode structure and the insulating pattern; and a protective film between the electrode structure and the charge storage film, wherein the electrode structure has a first length and the protective film has a second length less than the first length. The insulating pattern may have a third length which is less than the second length.

Also, the electrode structure may include an alternating pattern of gate electrodes and insulating layers, a distance between a lower surface of the electrode structure and an upper surface of the uppermost gate electrode is a fourth length, and the fourth length is less than the first length, the second length, and the third length.

Also, a conductive pattern may be formed between a bit line and an upper surface of the insulting pattern, wherein the protective film at least partially overlaps the conductive pattern. The charge storage film may at least partially extends between an upper surface of the protective film and an upper surface of the electrode structure.

BRIEF DESCRIPTION OF THE DRAWINGS

Features will become apparent to those of ordinary skill in the art by describing in detail exemplary embodiments with reference to the attached drawings in which:

FIG. 2 illustrates a memory block in FIG. 1;

DETAILED DESCRIPTION

Figure 1:
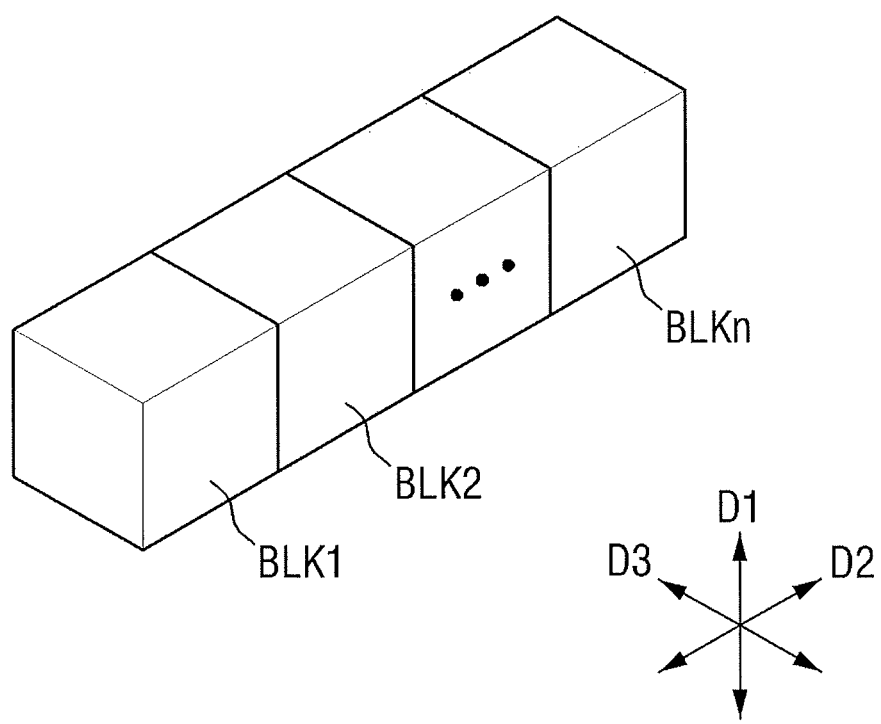
FIG. 1 illustrates a conceptual view of a nonvolatile memory device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will convey exemplary implementations to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

FIG. 1 is a conceptual diagram showing a memory cell array of a nonvolatile memory device. The memory cell array includes a plurality of memory blocks BLK1 to BLKn (where, n is a natural number). Each memory block BLK1 to BLKn may have a three-dimensional configuration of memory cells arranged in first to third directions D1, D2, and D3. As illustrated, the first to third directions D1, D2, and D3 may be directions which cross one another and may be different directions. For example, the first to third directions D1, D2, and D3 may be directions which cross one another at right angles, but the directions may cross one another at one or more different angles in other embodiments.

Figure 3:
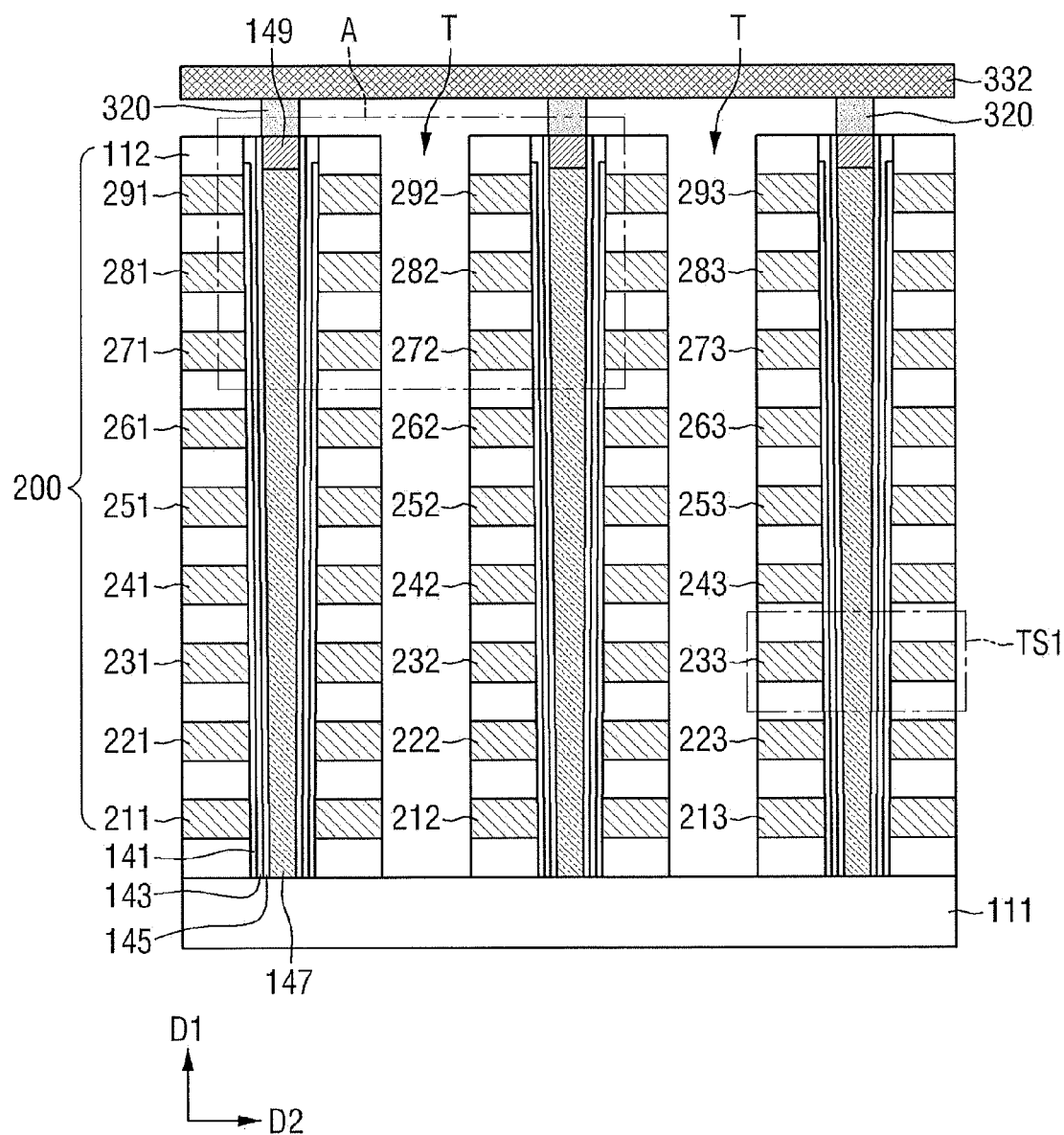
FIG. 3 illustrates a cross-sectional view taken along line I-I' of FIG. 2.
Figure 4:
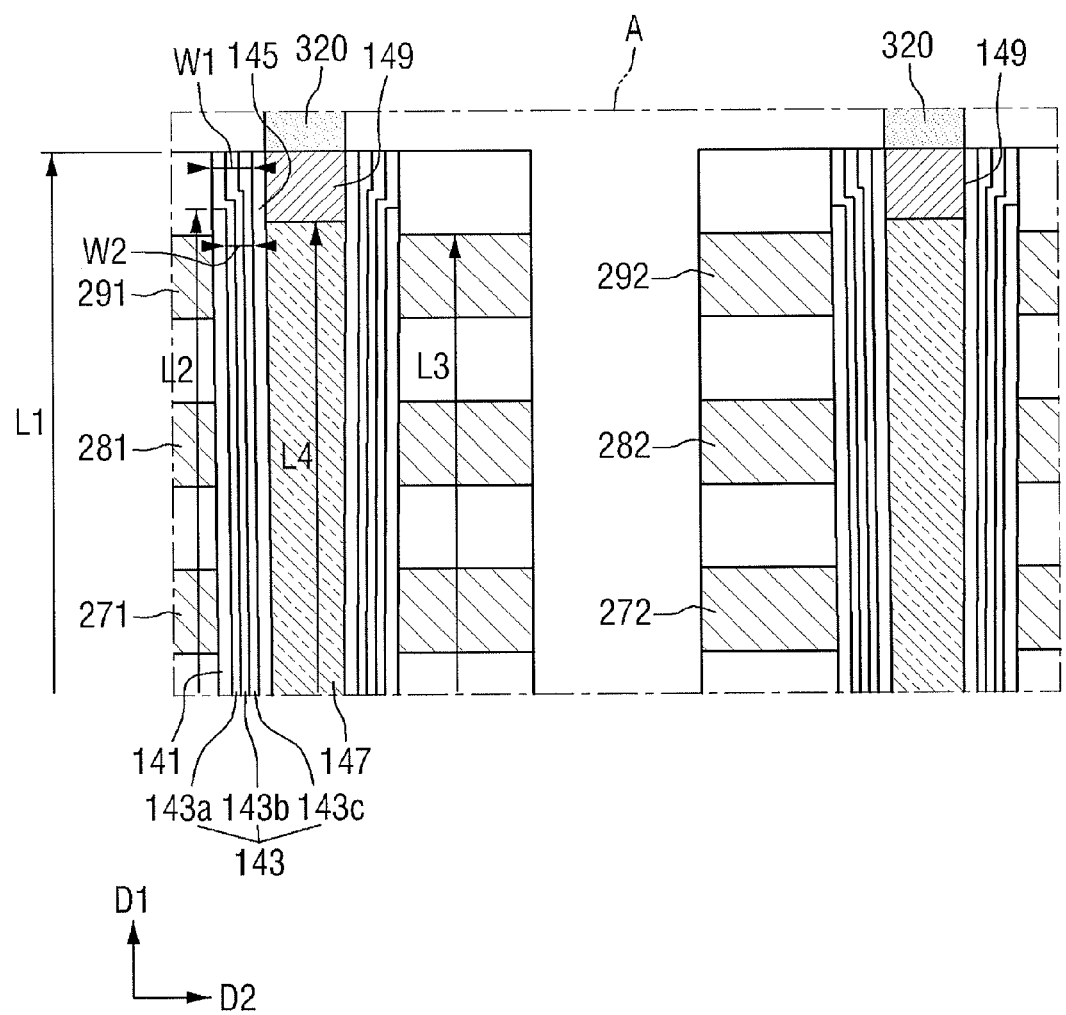
FIGS. 4 and 5 illustrate enlarged views of area A in FIG. 3 according to a first embodiment.
Figure 5:
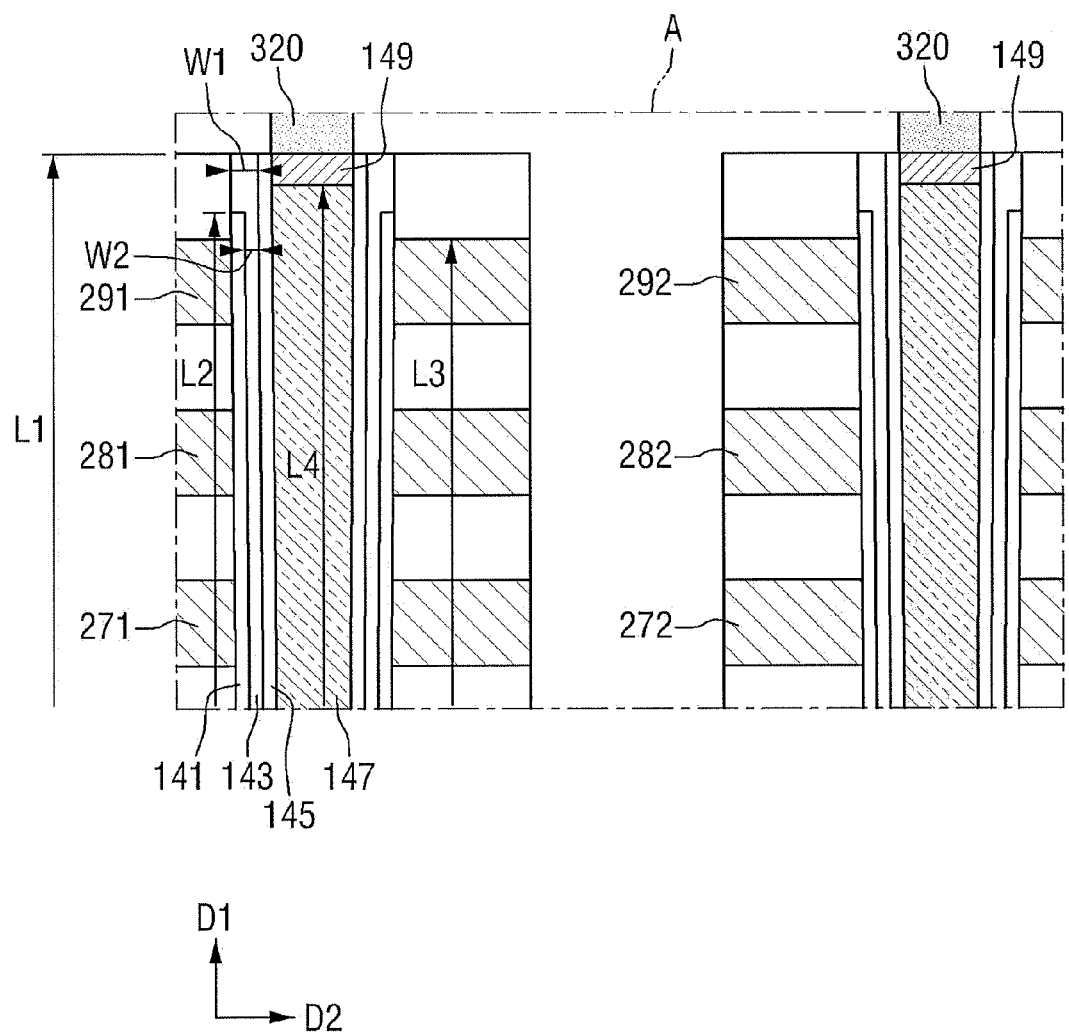

FIG. 2 shows a first embodiment of a three-dimensional memory block that may be included in FIG. 1, FIG. 3 is a cross-sectional view taken along line I-I' of FIG. 2, and FIGS. 4 and 5 are enlarged views of area A in FIG. 3.

Referring to FIGS. 2 to 4, a memory block BLKi (where, 1≤i≤n, i is a natural number) may include a plurality of interlayer insulating films 112, a plurality of gate electrodes 211 to 291, 212 to 292, and 213 to 293, a plurality of insulating patterns 147, a conductive pattern 149, a protection film 141, a charge storage film 143, a channel film 145, and bit lines 331 to 333, which are formed on a semiconductor substrate 111.

The plurality of interlayer insulating films 112 may sequentially be laminated to be spaced apart from each other in the first direction D1. As illustrated in FIG. 2, the plurality of interlayer insulating films 112 may extend in the third direction D3, and each interlayer insulating film 112 may be made of an oxide or another insulating material.

The plurality of gate electrodes 211 to 291, 212 to 292, and 213 to 293 may be disposed between the plurality of interlayer insulating films 112, respectively. The plurality of gate electrodes 211 to 291, 212 to 292, and 213 to 293 may be formed in the third direction D3 and may be laminated in the first direction D1. The plurality of gate electrodes 211 to 201, 212 to 292, and 213 to 293 and the plurality of interlayer insulating films 112, which are laminated as above, may be referred to as an electrode structure 200. The plurality of gate electrodes 211 to 291, 212 to 292, and 213 to 293 may be formed of a conductive material such as, for example, tungsten (W), cobalt (Co), and nickel (Ni), or a semiconductor material such as silicon.

The plurality of gate electrodes 211 to 291, 212 to 292, and 213 to 293 may be formed between the plurality of laminated interlayer insulating films 112, respectively. The plurality of gate electrodes 211 to 291, 212 to 292, and 213 to 293 may be formed to cross the plurality of insulating patterns 147. Although the plurality of gate electrodes 211 to 291, 212 to 292, and 213 to 293 are illustrated to have the same thickness in FIG. 2, they may have different thicknesses in other embodiments.

The insulating pattern 147 is formed in the first direction D1, and the plurality of gate electrodes 211 to 291, 212 to 292, and 213 to 293 are formed in the third direction D3. The plurality of insulating patterns 147 may be disposed, for example, in a pillar form on the substrate 111 and are formed to penetrate or extend beyond a surface of the electrode structure 200. That is, the electrode structure 200 may be disposed to surround the plurality of insulating patterns 147. As seen the cross-sectional view taken along line I-I' as shown in FIG. 3, the electrode structure 200 may be disposed on both sides of the insulating pattern 147.

As illustrated in FIGS. 2 and 3, the plurality of insulating patterns 147 may be disposed to be separate from each other in the second direction D2 and third direction D3. That is, the plurality of insulating patterns 147 may be disposed in a matrix form. Also, in FIGS. 2 and 3, the insulating patterns 147 are illustrated to be in a 3×3 matrix. However, the insulating patterns 147 may be provided in a matrix of a different size in other embodiments.

Separation spaces T may be formed in or between the plurality of electrode structures 200, and, more specifically, between the plurality of insulating patterns 147 disposed in the second direction D2. A plurality of channel films 145 disposed in the second direction D2 may be electrically connected with each other by the bit lines 331 to 333.

A conductive pattern 149 is formed on the insulating pattern 147. The conductive pattern 149 serves to electrically connect the channel films 145 with the bit lines 331 to 333. Because the width of the upper surface of the channel film 145 is narrow, the conductive pattern 149 may be formed on the insulating pattern 147 to supplement the upper surface of the channel film 145. The conductive pattern 149 is in contact with the channel film 145 and a bit line contact 320 to electrically connect the channel film 145 to the bit lines 331 to 333. In other embodiments, the insulating pattern 147 may be omitted, e.g., the conductive pattern 149 may provided without the insulating pattern 147.

A plurality of layers may be provided between the electrode structure 200 and the insulating pattern 147. These layers may include the protection film 141, the charge storage film 143, and the channel film 145.

The protection film 141 may extend in the first direction D1 along a side surface of the electrode structure 200. In one implementation, the height of the protection film 141 is lower than the height of the electrode structure 200. Specifically, as shown, for example, in FIG. 4, the length L2 that the protection film 141 extends in the first direction D1 may be shorter than the length L1 that the electrode structure 200 extends in the first direction D1.

Additionally, or alternatively, because it is necessary for the protection film 141 to protect the charge storage film 143 and the channel film 145, the upper surface of the protection film 141 may be higher than the upper surfaces of one or more of the first gate electrodes 291, 292, and 293, which are respectively located on uppermost sides of the plurality of gate electrodes 211 to 291, 212 to 293, and 213 to 293 in the electrode structure 200. In other words, L2 may be longer than a length L3, the latter of which may extend from upper surfaces of one or more of the first gate electrodes 291, 292, and 293 to the substrate.

Additionally, or alternatively, the length L2 of the protection film 141 in the first direction D1 may be longer than a length L4 of the insulating film 147 in the first direction D1.

The protection film 141 may used in the process of forming the separation space T. More specifically, the electrode structure 200 may be etched in order to form the separation space T. However, if the protection film 141 were not used, one or more of the charge storage film 143, the channel film 145, and the insulating pattern 147 may be damaged. Accordingly, by disposing the protection film 141 along the side surface of the electrode structure 200, the charge storage film 143, the channel film 145, and the insulating pattern 147 can be protected during the process of forming the separation space T. The protection film 141 may be made of a material such as, for example, a polysilicon film a nitride film or an oxide film. Other materials may be used for the protection film 141 in other embodiments.

In one embodiment, the charge storage film 143 may be disposed between the protection film 141 and the insulating pattern 147 and conduction pattern 149. Also, the charge storage film 143 may be formed in the first direction D1 and have a length equal to or different from length L1.

Also, the charge storage film 143 may partially or entirely cover the upper surface of the protection film 141. More specifically, because the protection film 141 has length L2, a space that is as long as a length L1-L2 is provided on the upper surface of the protection film 141. This space may be filled with the charge storage film 143.

Accordingly, as illustrated in FIG. 4, a width W1 of the charge storage film 143 on the upper portion of the protection film 141 may be larger than a width W2 of the charge storage film 143 on the side surface of the blocking insulating film 141. Because the charge storage film 143 covers the upper surface of the protection film 141, the upper surface of the protection film 141 is not exposed.

Although the charge storage film 143 is illustrated as a single film in FIGS. 3 and 4, the charge storage film may be formed from a plurality of films in other embodiments. For example, in one implementation, the charge storage film may include a block insulating film a trapping film, and a tunnel film that extend in the first direction D1. Also, these films may be formed in the aforementioned order in a direction extending from the side surface of the protection film 141 to the side surface of the channel film 145.

According to one embodiment, the blocking insulating film may be disposed on the side surface of the protection film 141, the tunnel film may be disposed on the side surface of the channel film 145, and the trapping film may be disposed between the blocking insulating film and the channel film. In other embodiments, a different order, number, or type of films may be used for the charge storage film.

The blocking insulating film may prevent charge captured in the trapping film from being discharged to the plurality of gate electrodes 211 to 291, 212 to 292, and 213 to 293, and also may prevent charge on the plurality of gate electrodes 211 to 291, 212 to 292, and 213 to 293 from being captured in the trapping film.

Structurally, the blocking insulating film may be formed from a material that includes an insulating metal oxide having dielectric constant equal to or higher than that of silicon oxide. For example, the blocking insulating film may be formed as a multi-layer that is laminated by a high-k material such as aluminum oxide, hafnium oxide, lanthanum oxide, tantalum oxide, titanium oxide, lanthanum hafnium oxide, lanthanum aluminum oxide, or dysprosium scandium oxide, or a combination thereof. In other embodiments, the blocking insulating film may be formed from an insulating material different from a metal oxide, such as but not limited to a polymer.

The trapping film may be disposed between the blocking insulating film and the tunnel film, and may serve to store charge that has passed through the tunnel film. For example, the trapping film may be formed of a nitride film or a high-k film. The nitride film may include, for example, at least one of silicon nitride, silicon oxynitride, hafnium oxynitride, zirconium oxynitride, hafnium silicon oxynitride, or hafnium aluminum oxynitride. The high-k film may include, for example, at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The tunnel film may serve to pass charge between the channel film 145 and the trapping film. The tunnel film may be, for example, a silicon oxide film or a silicon nitride film, or a double layer of the silicon oxide film and a silicon nitride film.

The channel film 145 may be disposed between the charge storage film 143 and the insulating pattern 147. In one embodiment, the channel film 145 may extend up to the length L1 in the first direction D1. However, the channel film 145 may have a different length in other embodiments. Also, as shown in FIG. 4, the channel film 145 may be connected to the conductive pattern 149 and/or to the bit line contact 320. As the thickness of the channel film 145 becomes thinner, the current characteristic of the nonvolatile memory device may become better.

The channel film 145 provides the charge that is to be trapped or discharged by the charge storage film 143. Accordingly, the channel films 145 may be disposed on the side surfaces of the plurality of gate electrode 211 to 291, 212 to 292, and 213 to 293. The channel film 145 may be made from a material, for example, a semiconductor material such as monocrystalline silicon.

Also, in accordance with at least one embodiment, a nonvolatile memory cell TS1 may be considered to be formed in an area where the channel film 145 and the plurality of gate electrodes 211 to 291, 212 to 292, and 213 to 293 cross each other.

Referring to FIG. 5, unlike FIG. 4, the length L4 that the insulating pattern 147 extends in the first direction D1 may be longer than the length L2 that the protection film 141 extends in the first direction D1. However, because the conductive pattern 149 is formed on the upper surface of the insulating pattern, L3 may be shorter than L1 in this case.

Figure 6:
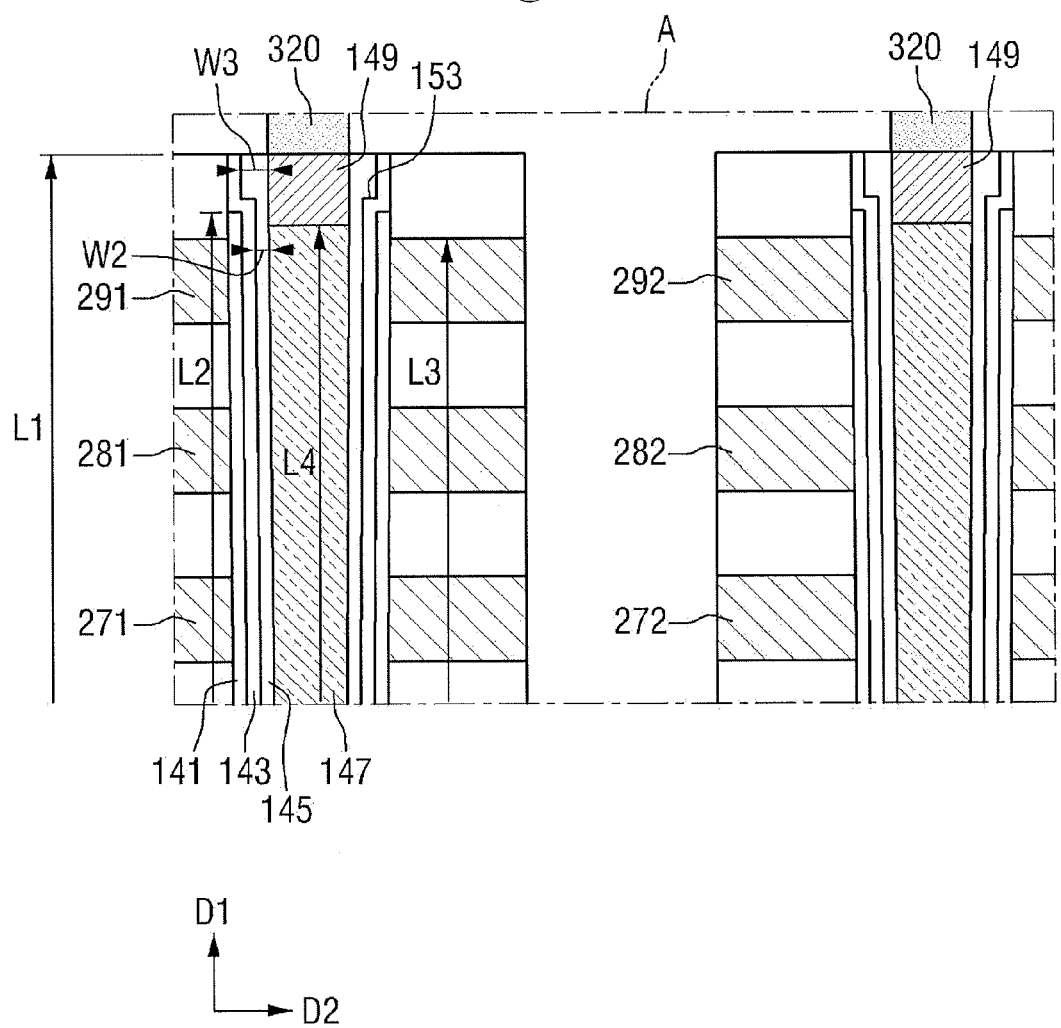
FIGS. 6 and 7 illustrate enlarged views of area A of FIG. 3 according to a second embodiment.
Figure 7:
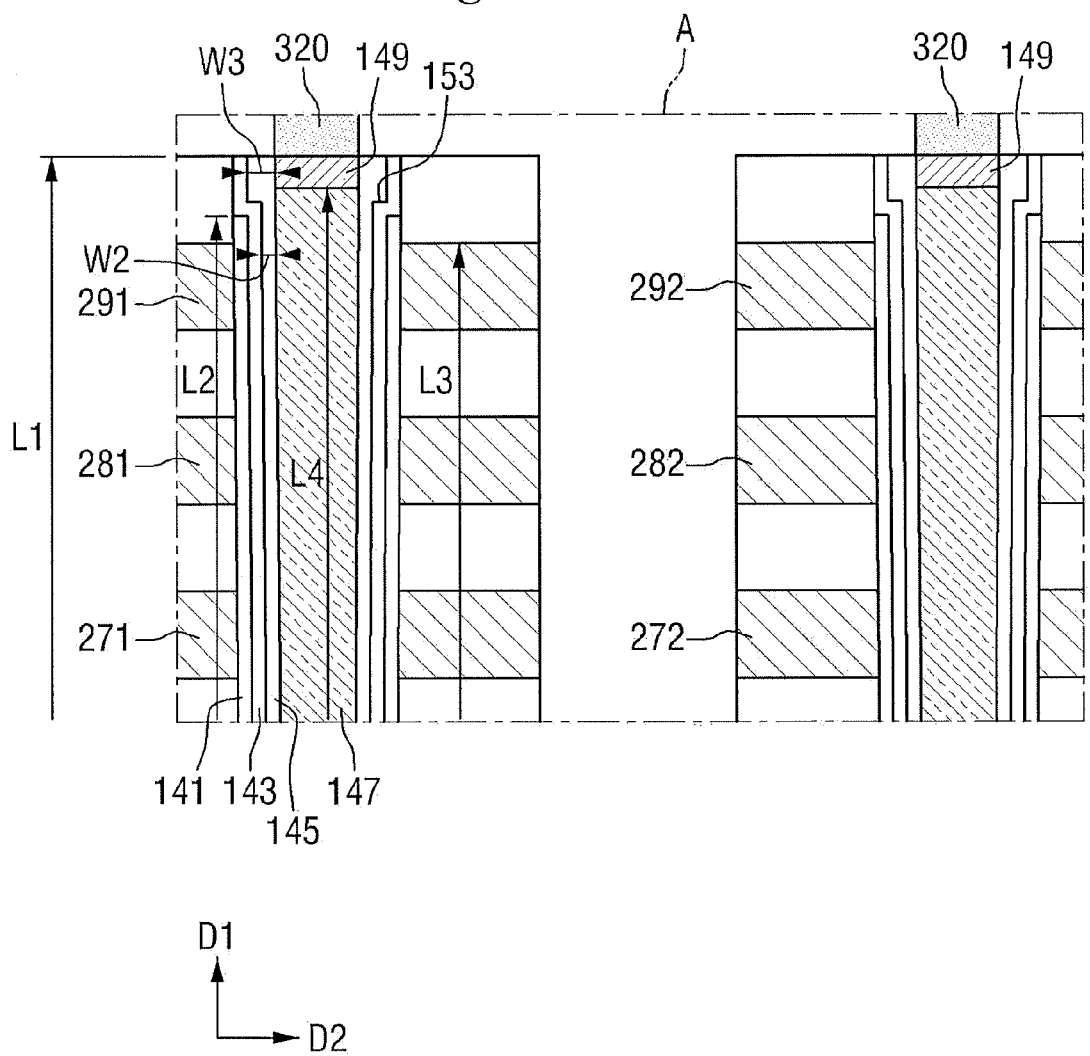

FIGS. 6 and 7 are enlarged views of area A of FIG. 3 according to a second embodiment. In this embodiment, unlike the first embodiment, the charge storage film 143 is formed with a constant width. Specifically, referring to FIGS. 6 and 7, the charge storage film 143 may be formed to conform along the side surface of the electrode structure 200, the upper surface of the protection film 141, and the side surface of the protection film 141.

Also, in the second embodiment, the channel film 145 may not be formed with a constant width. Specifically, because the channel film 145 is formed even on the upper portion of the second surface 153 of the charge storage film 145, the width W3 of the channel film 145 that is disposed on the second surface 153 of the charge storage film 145 may be larger than the width W4 of the channel film 145 that is disposed on the side surface of the charge storage film 143.

Like in the first embodiment, the length L2 that the protection film 141 extends in the first direction D1 may be longer than the length L4 that the insulating pattern 147 extends in the first direction D1.

In FIG. 7, unlike FIG. 6, the length of the insulating film 147 may be longer than the protection film 141. Specifically, referring to FIG. 7, the length L2 that the protection film 141 extends in the first direction D1 may be shorter than the length L4 that the insulating pattern 147 extends in the first direction D1.

Figure 8:
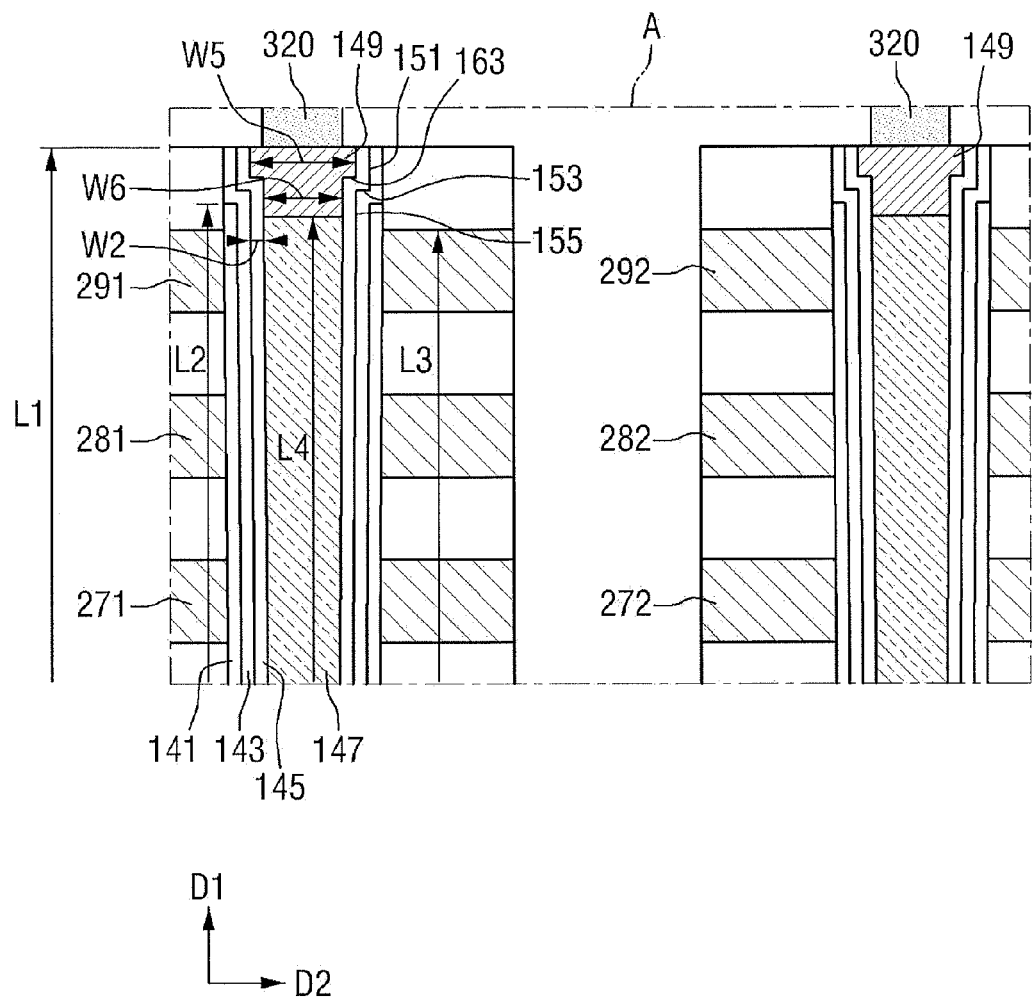
FIGS. 8 and 9 illustrate enlarged views of area A of FIG. 3 according to a third embodiment.
Figure 9:
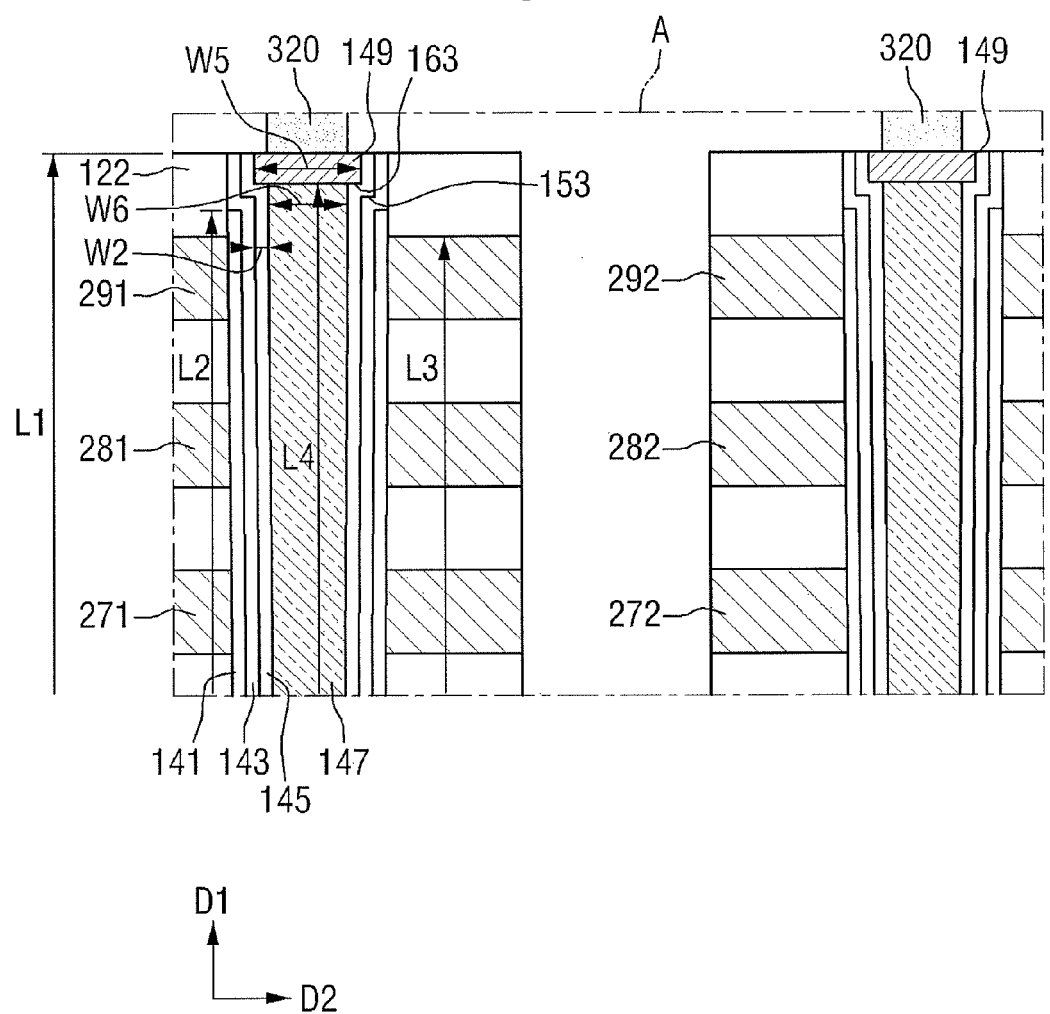

FIGS. 8 and 9 are enlarged views of area A of FIG. 3 according to a third embodiment. In this embodiment, the charge storage film 143 and the channel film 145 may have the same thickness. Specifically, the charge storage film 143 may formed to conform along the side surface of the electrode structure 200, the upper surface of the protection film 141, and the side surface of the protection film 141.

Also, the channel film 145 may be formed to conform along the side surface of the charge storage film 143, e.g., along the first surface 151, the second surface 153, and the third surface 155 of the charge storage film 143. Accordingly, unlike the first and second embodiments, the protection film 141, the charge storage film 143, and the channel film 145 may have the same thickness in all.

In the case where the charge storage film 143 and the channel film 145 are conformally formed, the insulating pattern 147 and the conduction pattern 149 may have different shapes. Specifically, referring to FIG. 8, if the upper surface of the insulating pattern 147 is lower than the first surface 163 of the channel film 145, the conductive pattern 149 has two widths W5 and W6. If the upper surface of the insulating pattern 147 is equal to the first surface 163 of the channel film 145, as shown in FIG. 9, the conductive pattern 149 may have the shape of a rectangle with a width W5, and the insulating pattern 147 may have the shape of a rectangle with a width W6 that is narrower than two widths W5. Although not illustrated in the drawing, if the upper surface of the insulating pattern 147 is higher than the first surface 163 of the channel film 145, the insulating pattern 149 may have two widths W5 and W6.

As a result, if the charge storage film 143 and the channel film 145 are conformally formed, the width of the conductive pattern 149 that covers the upper portion of the first surface 163 of the channel film 145 may be wider than that of the conductive pattern 149 of the nonvolatile memory device according to the first and second embodiments. If the width of the conductive pattern 149 is wide, the area in which the conductive pattern 149 becomes in contact with the bit line contact 320 becomes wide, and thus the reliability of the nonvolatile memory device is improved.

The first to third embodiments (FIGS. 2 to 9) correspond to the cases where the length L2 of the protection film 141 in the first direction D1 is different from the length L4 of the insulating pattern 147 in the first direction D1. However, these lengths may be different in other embodiments. For example, lengths L2 and L4 may be equal to each other.

Also, referring to FIGS. 2 to 9, in the first to third embodiments, because the length L2 of the protection film 141 in the first direction D1 is shorter than the length L1 of the electrode structure 200 in the first direction D1 and because the upper surface of the protection film 141 is covered by the charge storage film 143, the upper surface of the protection film 141 is not exposed.

Because the bit lines 311 to 333 are electrically connected to the channel film 145 and the width of the channel film 145 is narrow, in order to improve electrical connection with the bit line contact 320, the conductive pattern 149 that is connected to the channel film 145 may be disposed on the channel area 147 and the conductive pattern 149 may be connected to the bit line contact 320.

However, because of errors in the process of fabricating the nonvolatile memory, the bit line contact 32 may be formed with a width that is wider than the width of the conductive pattern 149. Also, because of the occurrence of errors in the process of disposing the bit line contact 320, the bit line contact 320 may not match the conductive pattern 149, but only parts of the bit line contact 320 and the conductive pattern 149 may be connected to each other.

In this case, if L2 and L1 are equal to each other and the upper surface of the protection film 141 is exposed when the above-described error occurs, a bridge may be formed between the bit line contact 320 and the protection film 141. If such a bridge is formed, current may flow along the protection film 141.

On the other hand, if L2 is formed to be shorter than L1 is the case in accordance with at least one embodiment, the likelihood that a bridge will form between the bit line contact 320 and the protection film 141 may be reduced or prevented. As a result, the likelihood that a nonvolatile memory device will malfunction can be reduced if this device is formed in accordance with one or more embodiments described herein.

Figure 10:
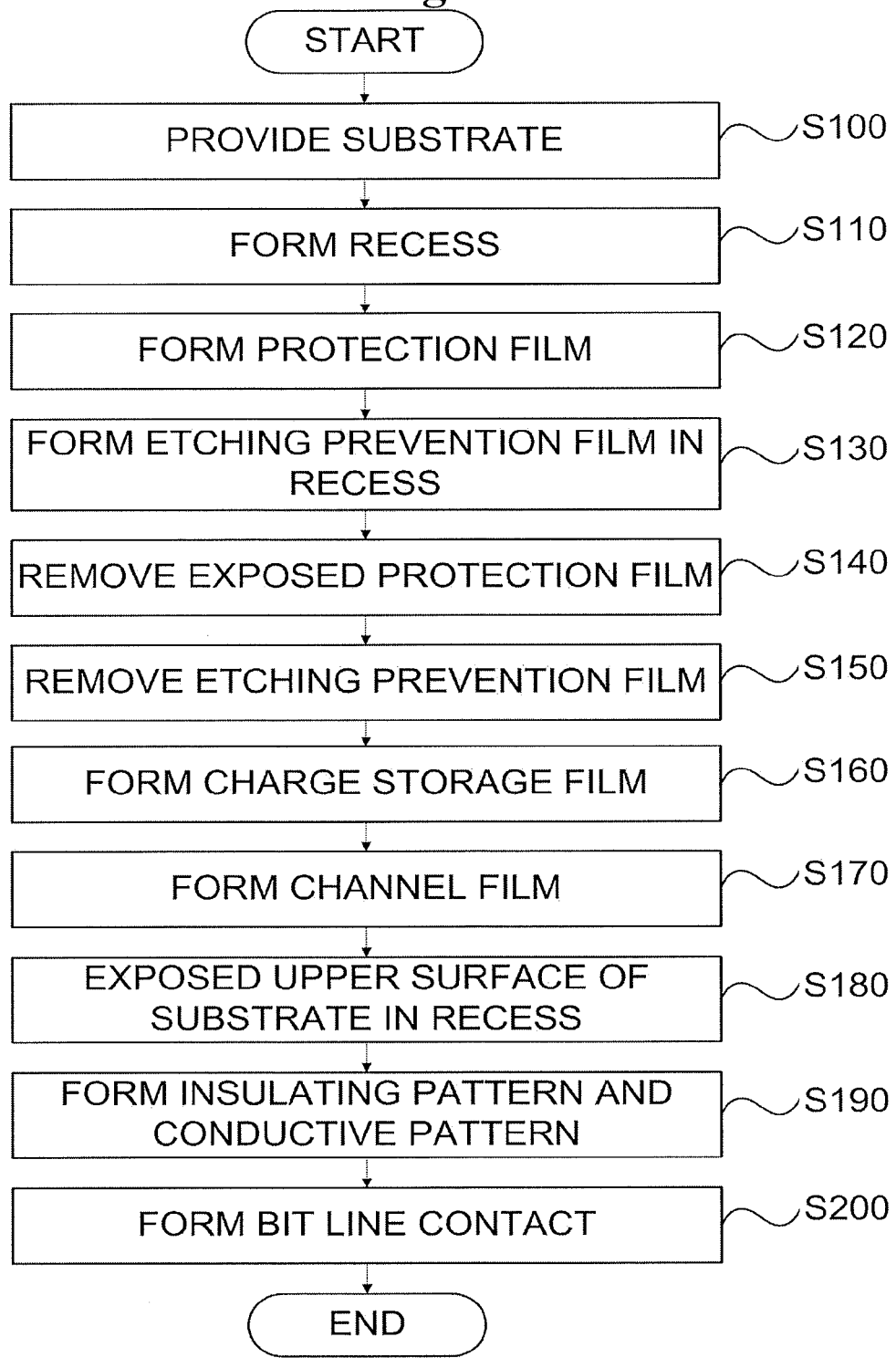
FIG. 10 illustrates one embodiment of a method for fabricating a nonvolatile memory device according to the third embodiment.

FIG. 10 is a flowchart showing operations included in an embodiment of a method for fabricating a nonvolatile memory device according to the third embodiment, and FIGS. 11 to 21 are views explaining results produced by intermediate operations of this method.

Figure 11:
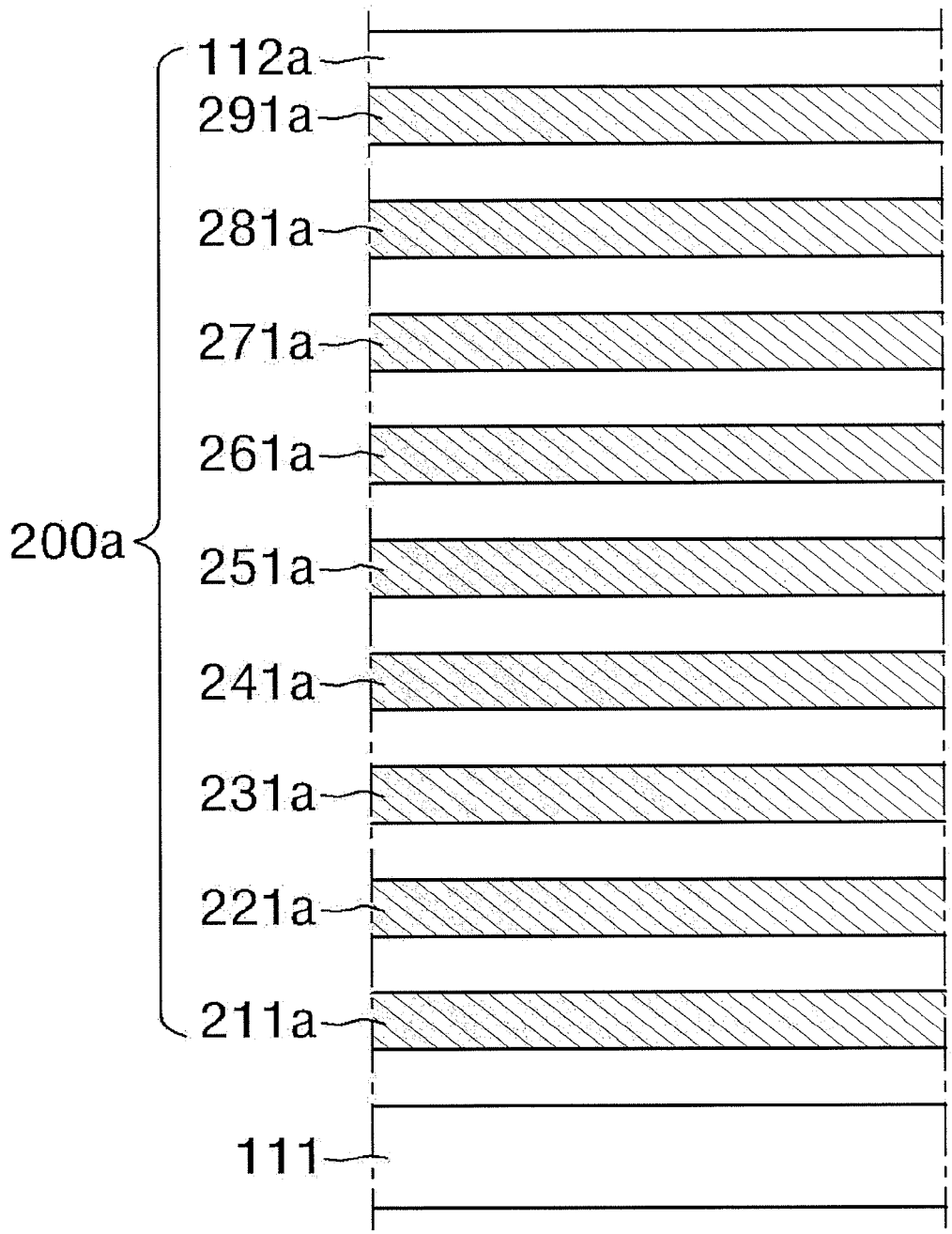
FIGS. 11 to 21 illustrates another embodiment of a method for fabricating a nonvolatile memory device according to the third embodiment.

First, referring to FIG. 10, a substrate is provided (S100). Referring to FIG. 11, the substrate may be formed to have an electrode structure 200a including a plurality of gate electrodes 211a to 291a and a plurality of interlayer insulating films 112a, which are alternately laminated on an upper surface of the substrate in a first direction D1.

Figure 12:
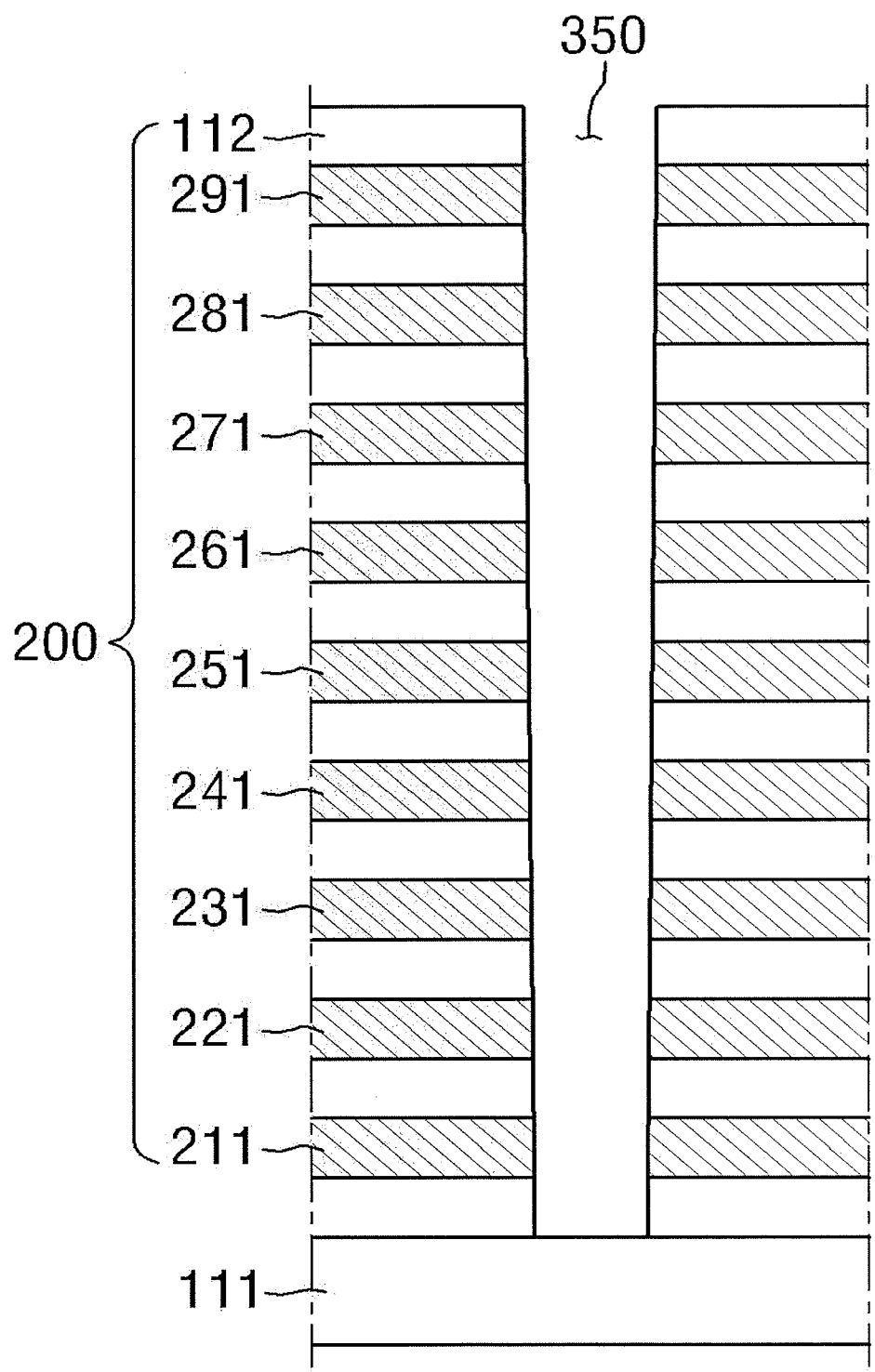

Then, referring again to FIG. 10, a recess is formed (S110). Referring to FIG. 12, the recess 350 that penetrates the electrode structure 200 is formed inside the electrode structure 200 so that a part of the upper surface of the substrate 111 is exposed. The recess 350 may be formed through a photolithography process and an anisotropic etching process.

Figure 13:
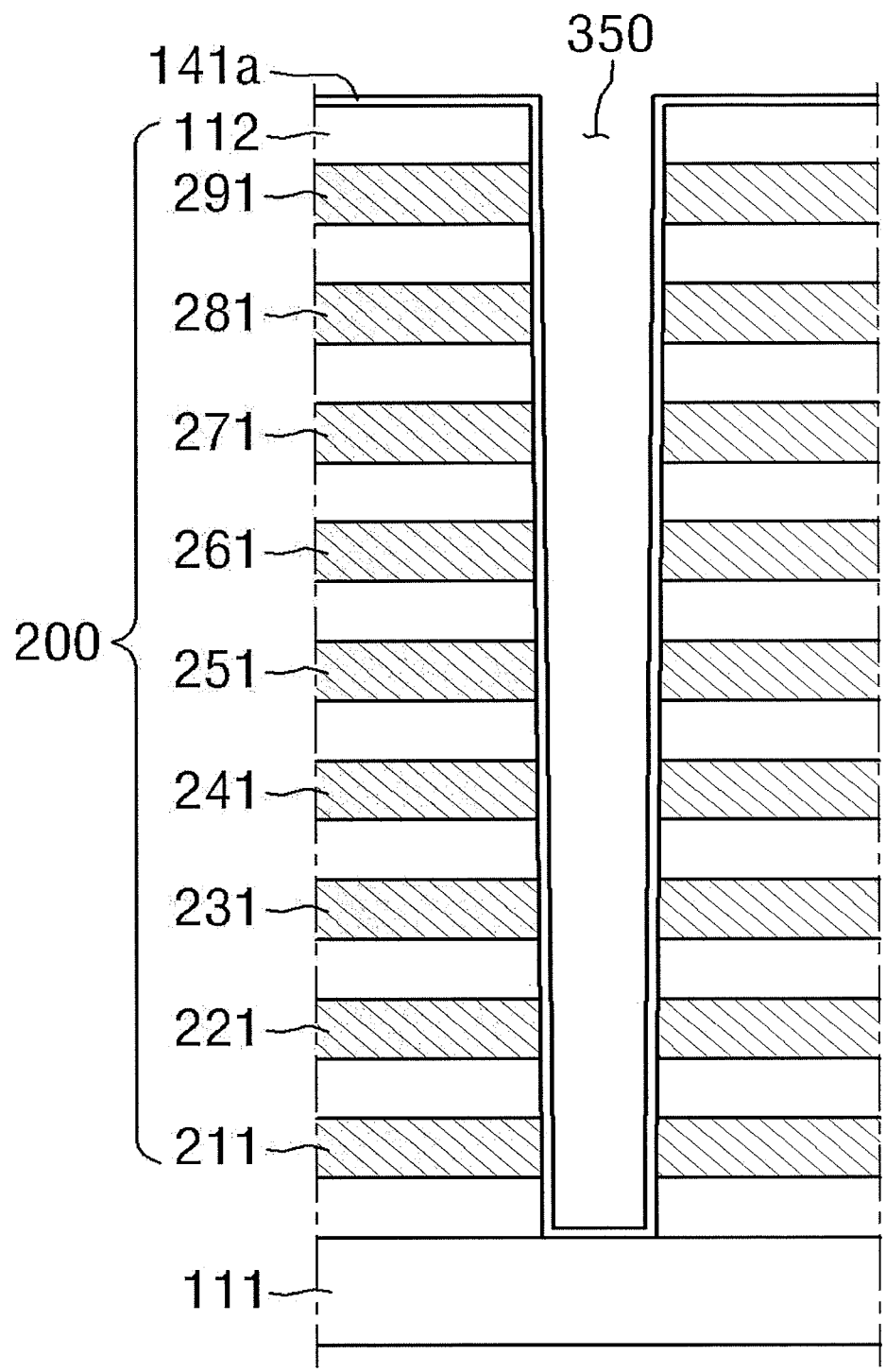

Then, referring again to FIG. 10, a protection film is formed (S120). Referring to FIG. 13, the protection film 141a is conformally formed on the recess 350. Specifically, the protection film 141a may be conformally formed on the inside of the recess 350 along the side surface of the electrode structure 200 and the upper surface of the substrate 111. The protection film 141a may also be formed on the upper surface of the electrode structure 200 in the process of forming the protection film 141a. The protection film 141a may be formed, for example, using an ALD (Atomic Layer Deposition) process, but is not limited thereto.

Figure 14:
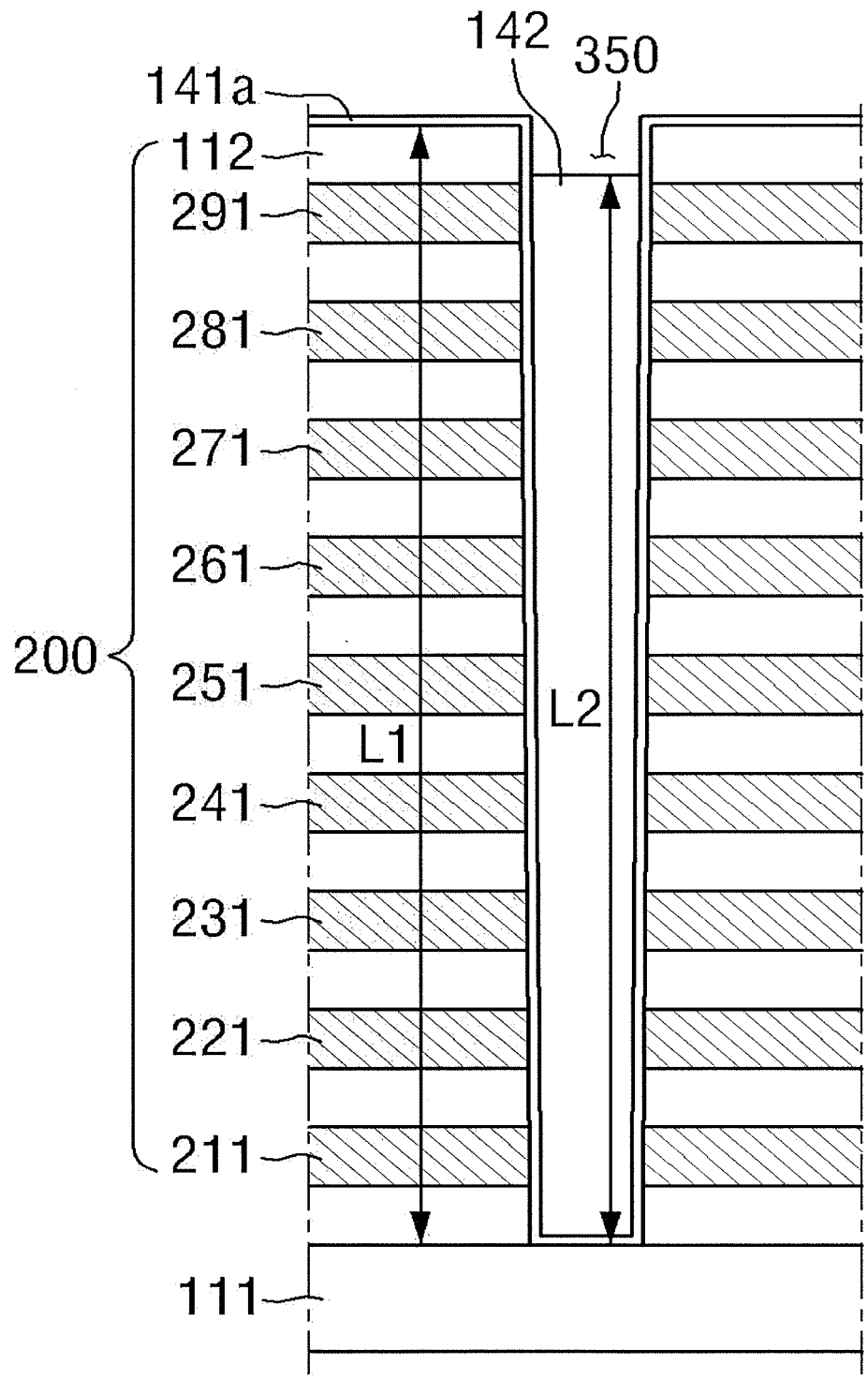

Then, referring again to FIG. 10, an etching prevention film is formed in the recess (S130). Referring to FIG. 14, the etching prevention film 142 is formed in the recess 350 in which the protection film 141a is conformally formed. The recess 350 may be filled with the etching prevention film 141a up to a second height that is lower than the upper surface of the electrode structure 200. Because the protection film 141 (in FIG. 8) is formed up to the height at which the recess 350 is filled with the etching prevention film 142 through the following process, the second height of the etching prevention film 142 may be formed to be equal to the length L2 of the protection film 141 (in FIG. 8) in the first direction.

If the etching prevention film 142 is formed up to length L2, a part of the protection film 141a, that is, the protection film 141 that is disposed to be higher than the upper surface of the etching prevention film 142, is exposed to outside. Also, the length L2 that extends from the substrate 111 to the upper surface of the etching prevention film 142 may be longer than the length L3 that extends from the upper surface of the substrate 111 to the upper surface of the first gate electrode 291. The etching prevention film 142 may be, for example, a SOH (Spin On Hardmask).

Figure 15:
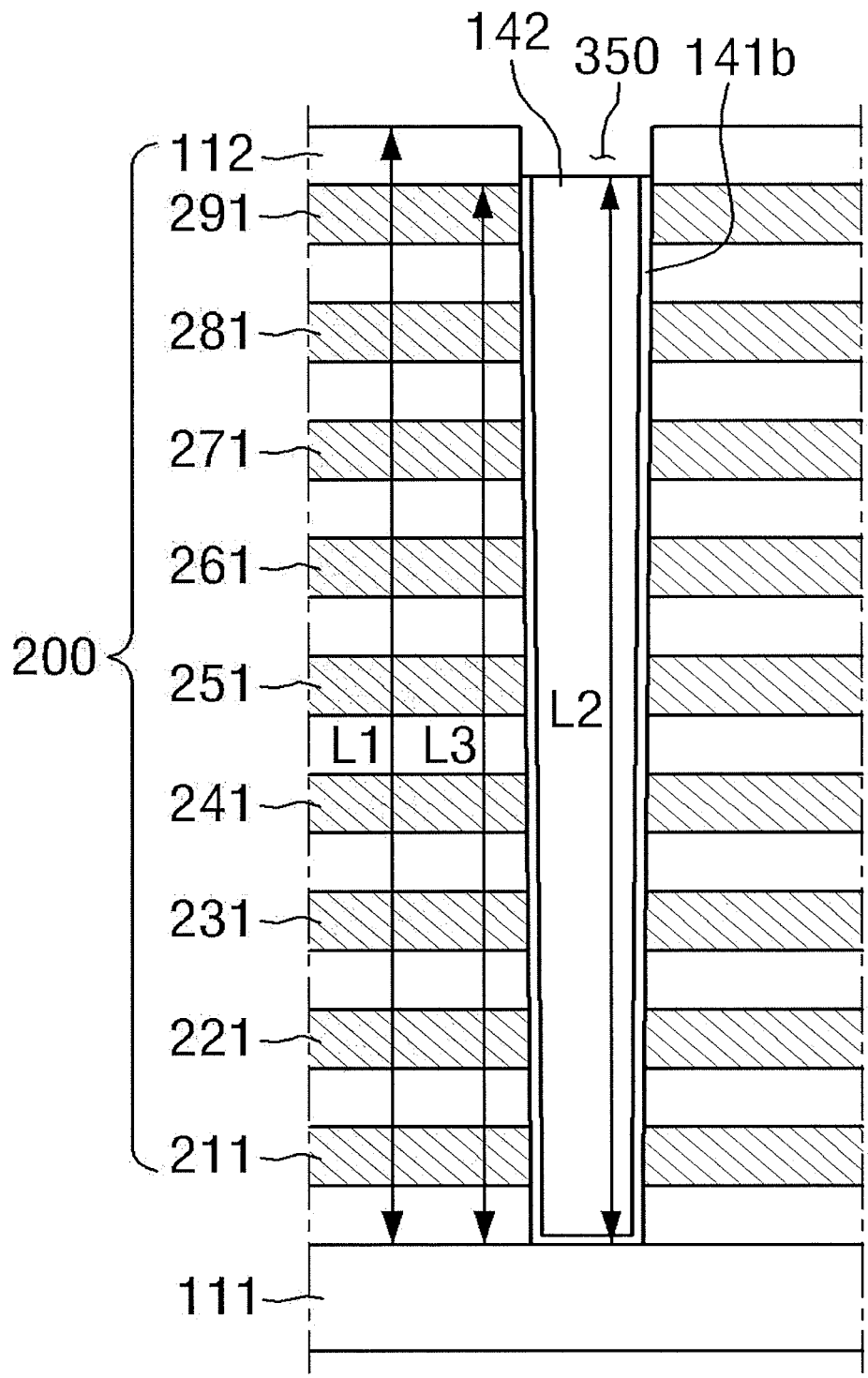

Referring again to FIG. 10, the exposed protection film is removed (S140). Referring to FIG. 15, by removing the protection film 140a (in FIG. 14) of the exposed portion that is not covered by the etching prevention film 142, only the protection film 141b of the portion that is covered by the etching prevention film 142 remains in the recess 350.

Figure 16:
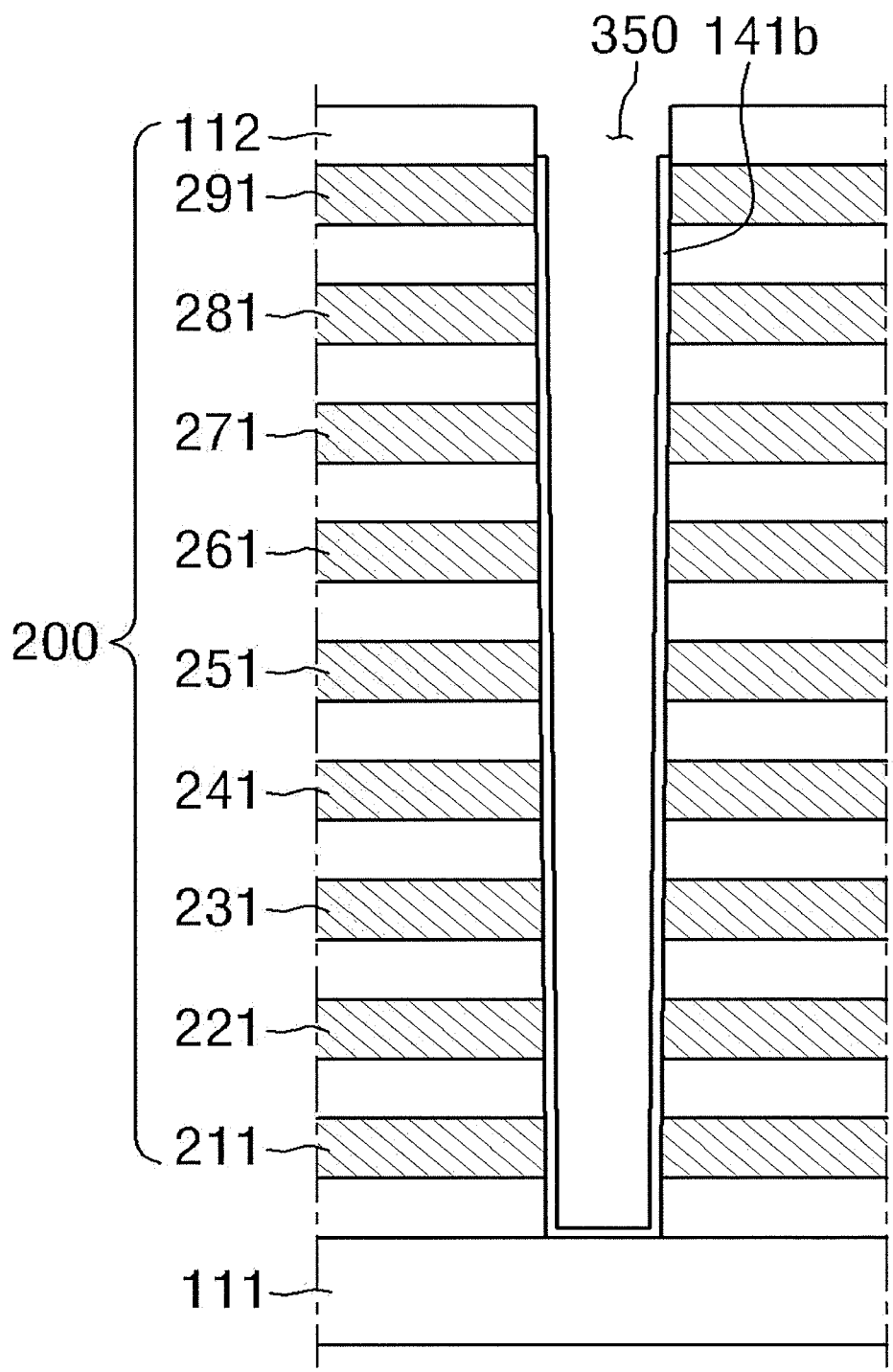

Then, referring again to FIG. 10, the etching prevention film is removed (S150). Referring to FIG. 16, the protection film 141b of which the upper portion has been removed is exposed by removing the etching prevention film 142 (in FIG. 15) that is formed in the recess 350.

Figure 17:
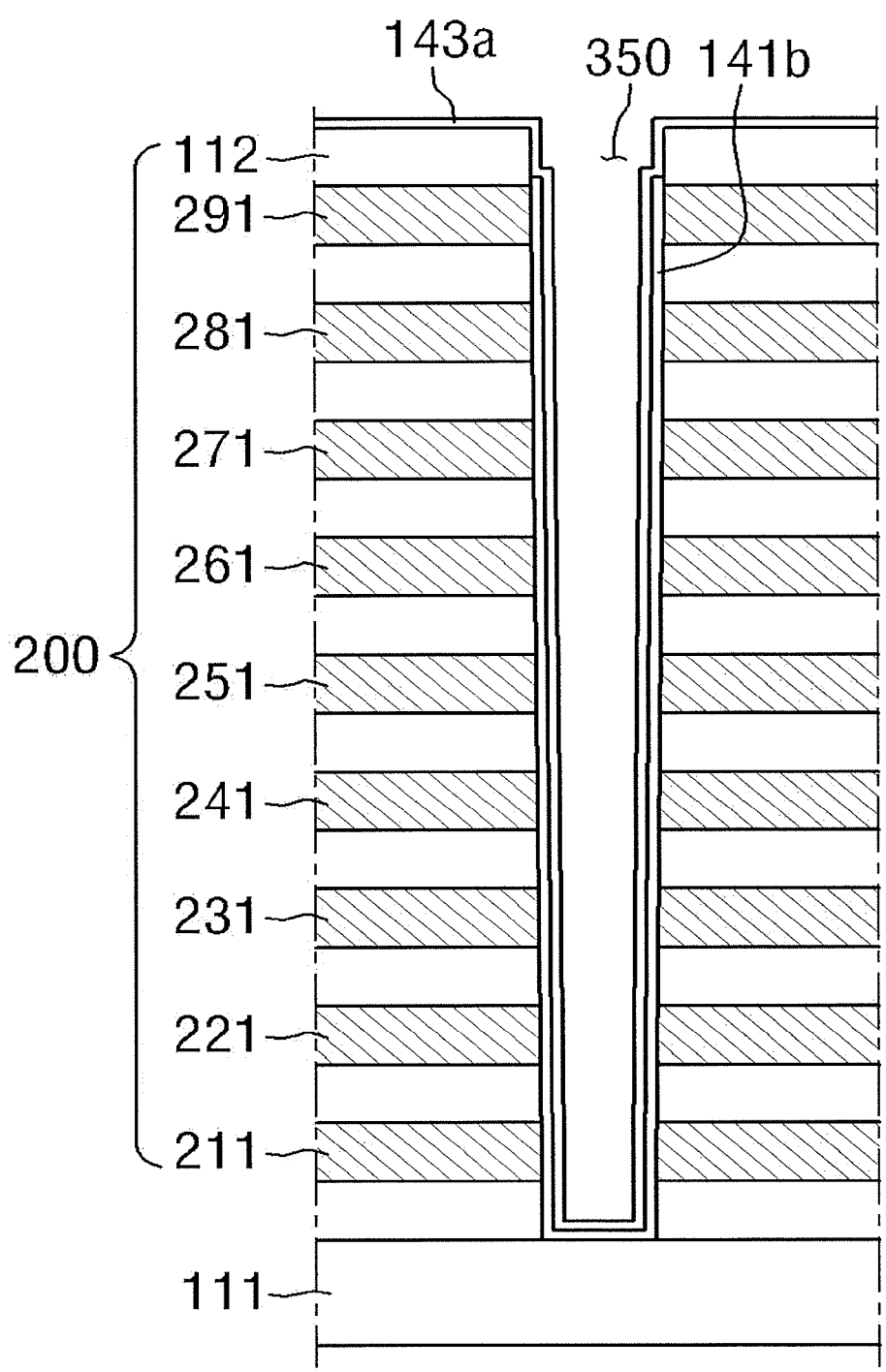

Then, referring again to FIG. 10, the charge storage film is formed (S160). Referring to FIG. 17, the charge storage film 143a is formed on the inside of the recess 350 so that the upper surface of the protection film 141 is not exposed. Specifically, the charge storage film 143a may conformally be formed along the upper surface of the electrode structure 200, the side surface of the electrode structure 200, the upper surface of the protection film 141b, and the side surface oft the protection film 141b. The charge storage film 143a may be formed, for example, using the ALD process.

On the other hand, the charge storage film 143a may include a blocking insulating film, a trapping film, and a tunnel film. In this case, the blocking insulating film may be formed to conform along the upper surface of the electrode structure 200, the side surface of the electrode structure 200, the upper surface of the protection film 141b, and the side surface of the protection film 141b. The trapping film may be formed to conform along the surface of the blocking insulating film. The tunnel film may be formed to conform along the surface of the trapping film.

Figure 18:
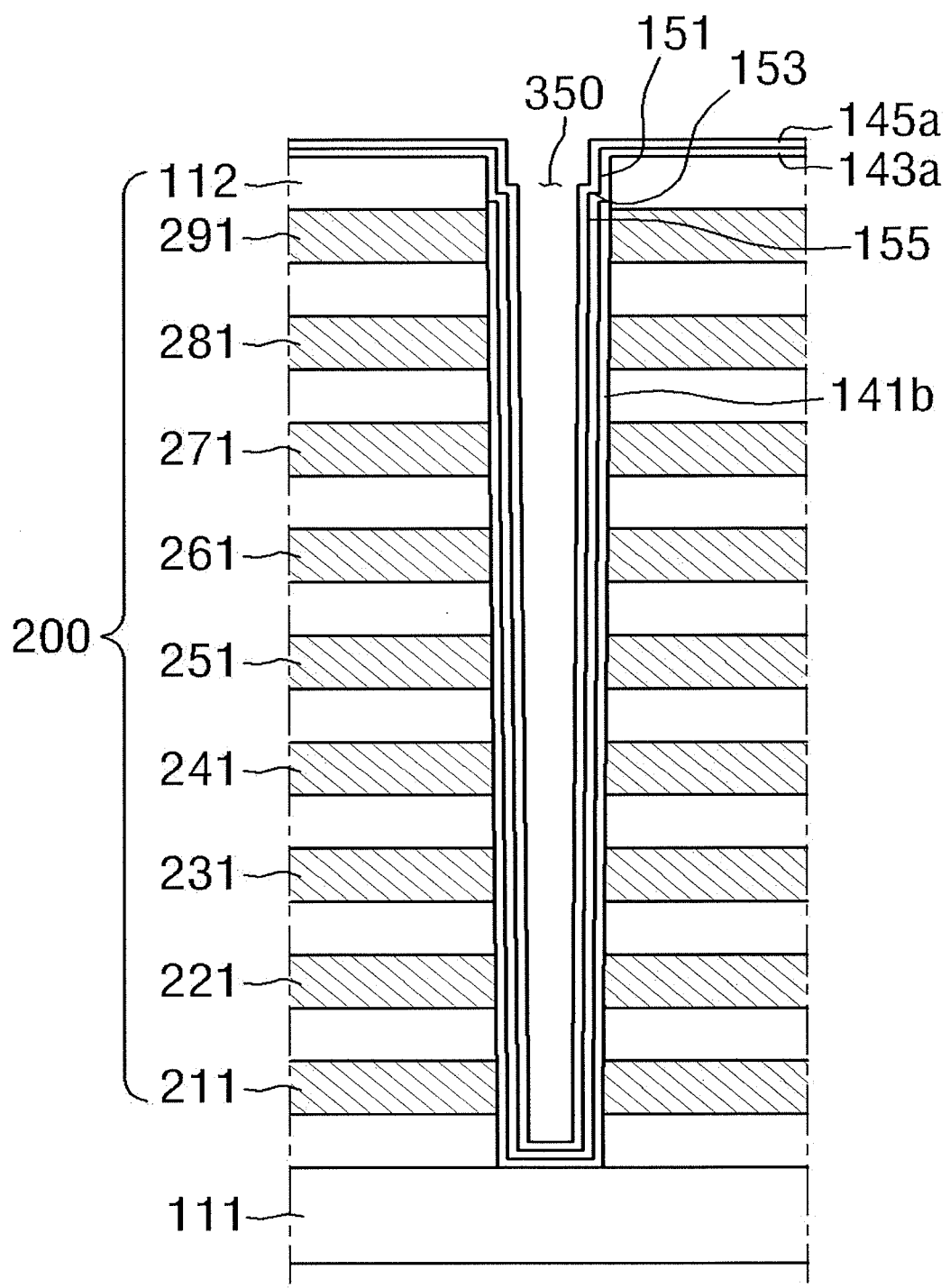

Then, referring again to FIG. 10, the channel film is formed (S170). Referring to FIG. 18, the channel film 145 may be formed to conform along the surface of the charge storage film 143a. Specifically, the channel film 145 may conformally be formed along the first surface 151, the second surface 153, and the third surface 155 of the charge storage film 143a in the recess 350.

Figure 19:
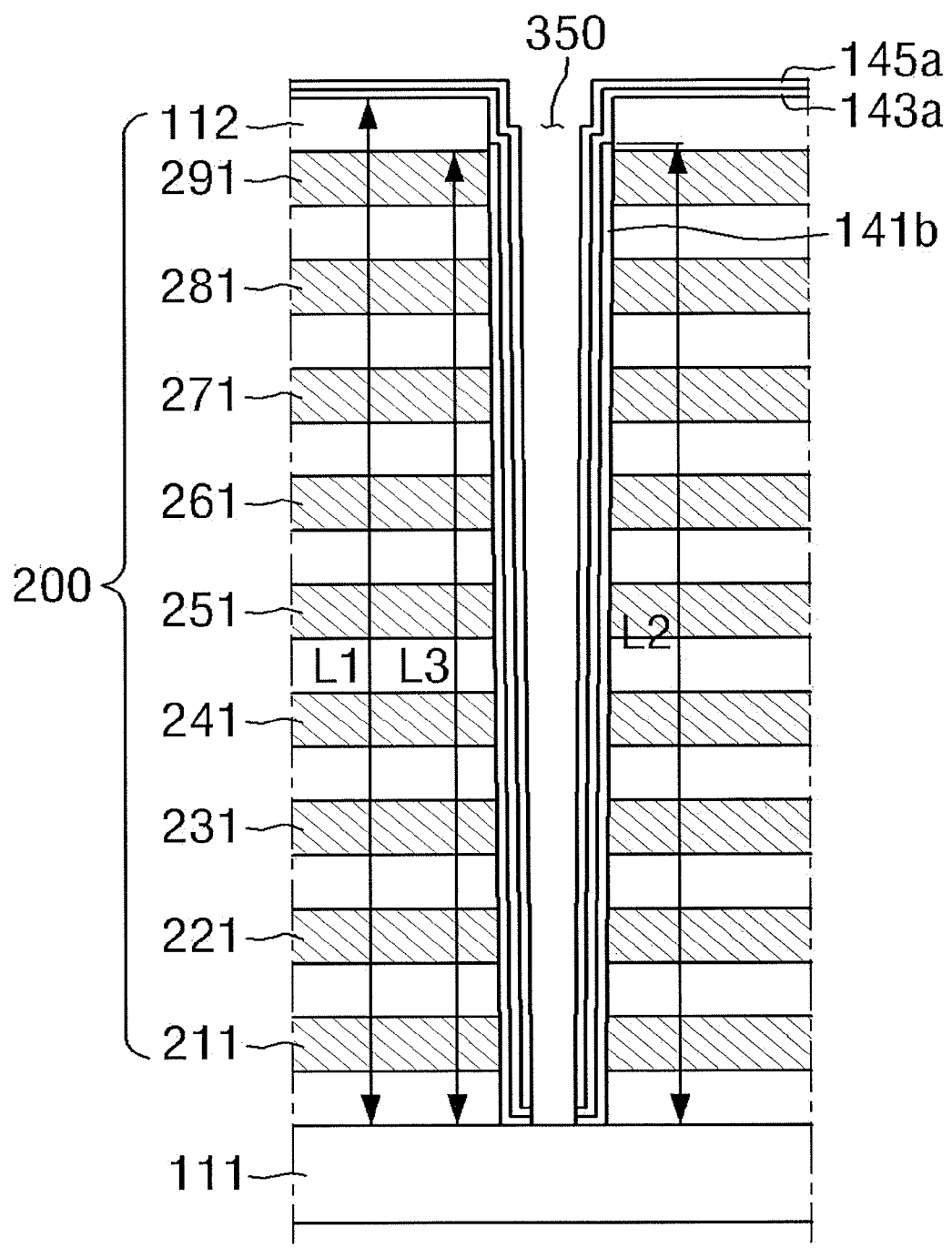

Then, referring again to FIG. 10, the upper surface of the substrate in the recess is exposed (S180). Referring to FIG. 19, the protection film 141b that extends in the first direction D1 along the side surface of the electrode structure 200, the charge storage film 143a, and the channel film 145a remain in the recess 350. The protection film 141b that is disposed on the upper surface of the substrate 111, the charge storage film 143a, and the channel film 145a are removed. As a result, the upper surface of the substrate 111 is exposed in the recess 350.

Figure 20:
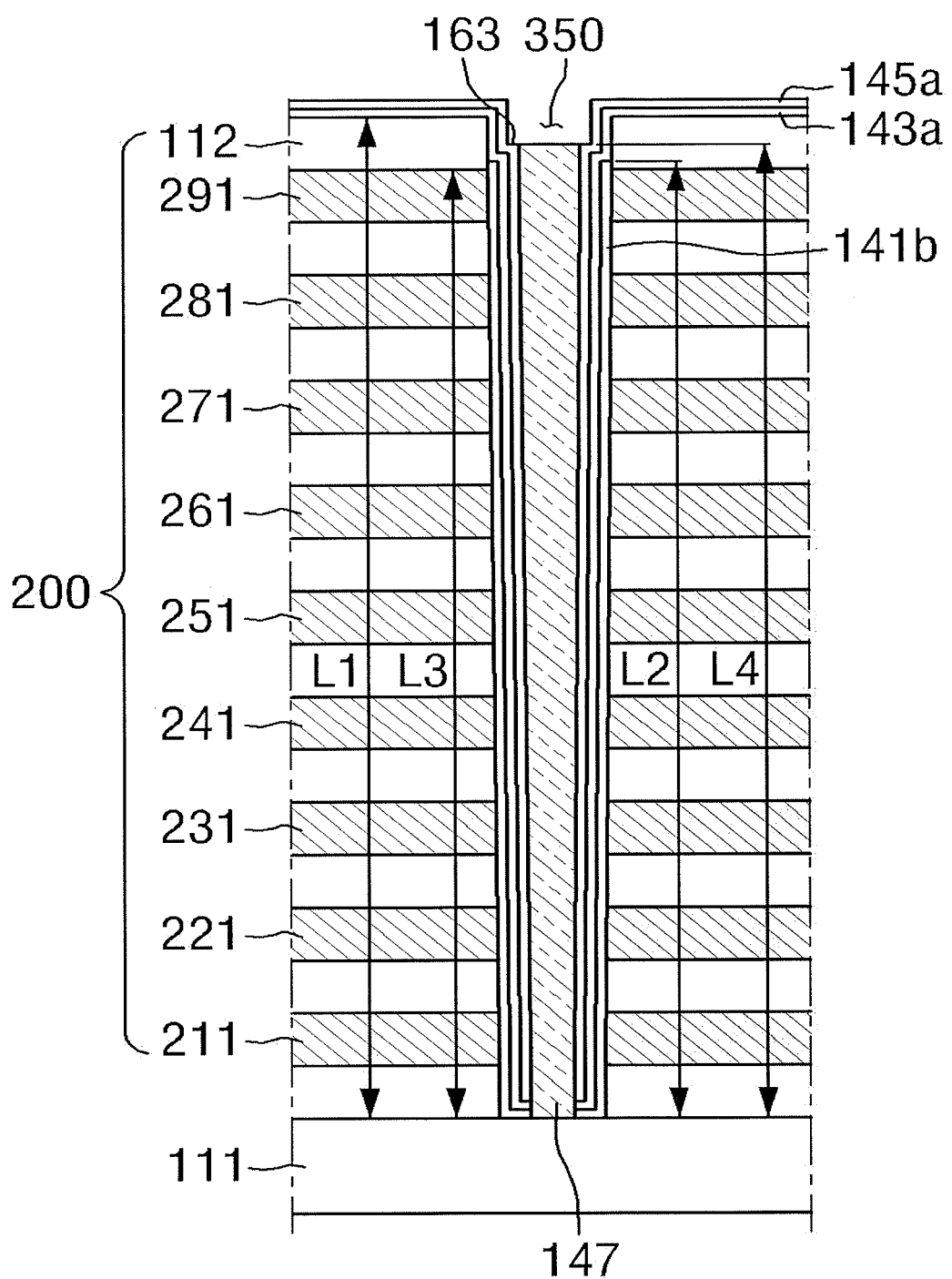
Figure 21:
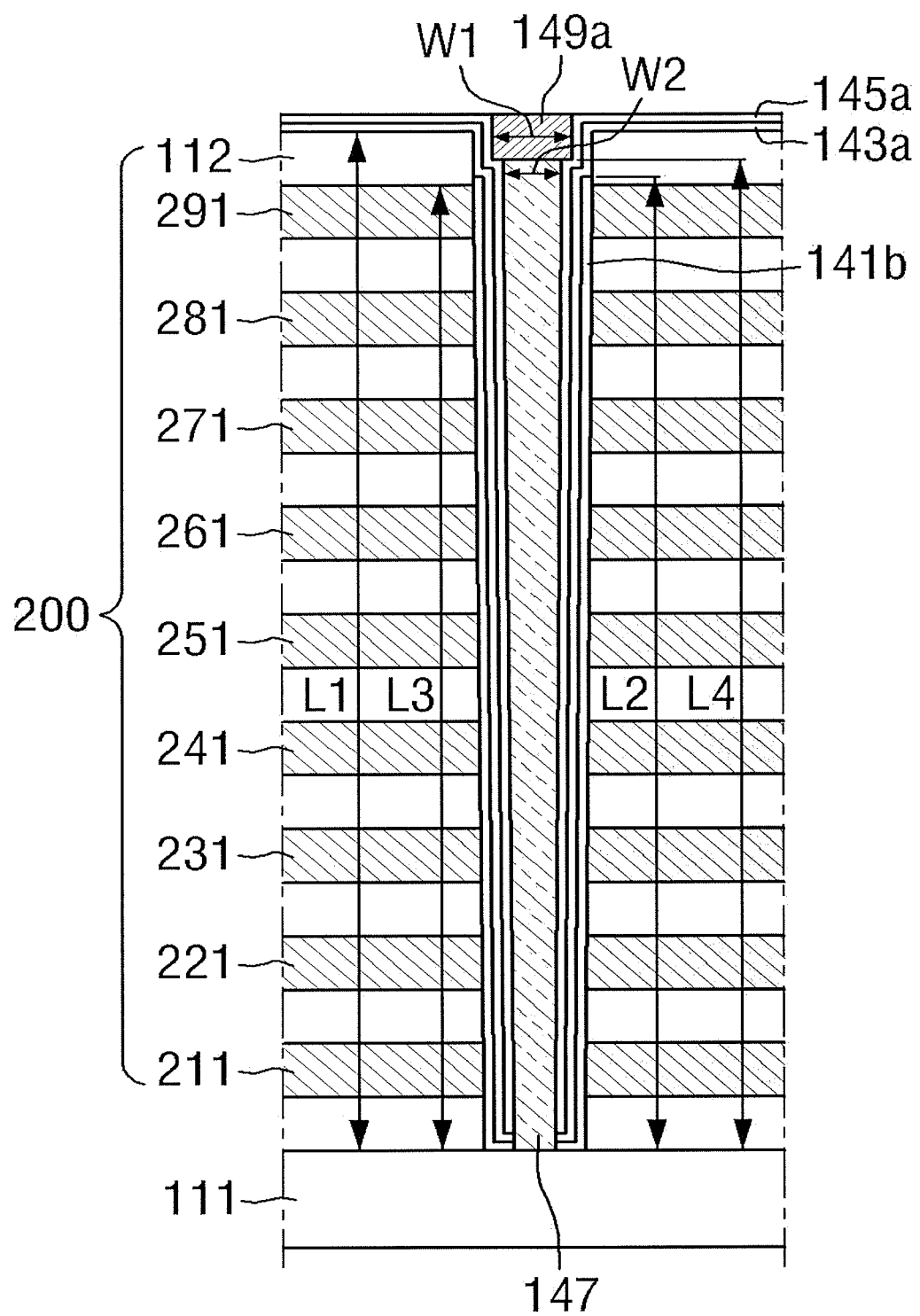

Then, referring again to FIG. 10, an insulating pattern and a conductive pattern are formed in the recess (S190). Referring to FIGS. 20 and 21, the insulating pattern 147 is formed on the upper surface of the exposed substrate 111, and the conductive pattern 149 is formed thereon. The insulating pattern 147 may be formed to be as long as the length L4 that extends from the upper surface of the substrate 111 in the first direction D1. The conductive pattern 149a may be formed on the remaining portion. The upper surface of the insulating film 147 may have the same or a different height as the first surface 163 of the channel film 145a. If the same height, the width W5 of the conductive pattern 149a may be wider than the wide W6 of the insulating pattern 147 (see FIG. 9).

Then, referring to FIG. 10, a bit line contact is formed (S200). In FIG. 21, the upper surface of the electrode structure 200 may be exposed using a CMP (Chemical Mechanical Polishing) process or the like, and the electrode structure 200 may be formed to extend from the upper surface of the substrate 111 to the length L1 extending in the first direction D1. After performing the CMP process, a separation space T (in FIG. 4) is formed in the electrode structure 200, and the bit line contact 320 is formed on the conductive pattern 149 to complete the fabrication of the nonvolatile memory device having the shape as shown in FIG. 8.

Although the method for fabricating a nonvolatile memory device according to the third embodiment has been described for illustrative purposes, those skilled in the art will appreciate that nonvolatile memory devices according to the other embodiments described herein can be fabricated through these or similar operations.

By way of summation and review, a semiconductor device including a three-dimensional nonvolatile memory device includes one or more electrode structures equipped with protection films. Each protective film extends between an interior surface of the electrode structure and an insulating pattern, in order to protect damage to one or more layers during device formation. The layers to be protected may include a channel storage film and/or a channel film. The length of the protective film may be shorter than the length of the electrode structure. In this case, at least a portion of the channel storage film may extend between an upper surface of the protective film and an upper surface of the electrode structure. Also, the length of the protective film may allow the protective film to extend above upper surfaces of the insulating pattern and an upper gate electrode of the electrode structure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A nonvolatile memory device comprising:
   a substrate;
   an insulating pattern extending in a first direction on the substrate;
   a conductive pattern on the insulating pattern;
   an electrode structure including a plurality of gate electrodes and a plurality of interlayer insulating films in an alternating pattern and extending in the first direction, the electrode structure adjacent the insulating pattern and the conductive pattern; and
   a protection film adjacent a side surface of the electrode structure, wherein a length of the protection film in the first direction is shorter than a length of the electrode structure in the first direction, wherein the protection film overlaps at least two of the gate electrodes of the electrode structure.

2. The nonvolatile memory device as claimed in claim 1, wherein the length of the protection film in the first direction is longer than a length between an upper surface of the substrate and an upper surface of an uppermost gate electrode of the plurality of gate electrodes.

3. The nonvolatile memory device as claimed in claim 2, further comprising:
   a charge storage film between the protection film and a region that includes the insulating pattern and at least a portion of the conductive pattern; and
   a channel film between the charge storage film and the region that includes the insulating pattern and the conductive pattern.

4. The nonvolatile memory device as claimed in claim 3, wherein the charge storage film comprises:
   a blocking insulating film on a side surface of the protection film;
   a tunnel film on a side surface of the channel film; and
   a trapping film between the blocking insulating film and the tunnel film.

5. The nonvolatile memory device as claimed in claim 3, wherein the charge storage film overlaps an upper surface of the protection film.

6. The nonvolatile memory device as claimed in claim 5, wherein the charge storage film at least substantially conforms to the side surface of the electrode structure, an upper surface of the protection film, and a side surface of the protection film.

7. The nonvolatile memory device as claimed in claim 5, wherein the channel film conforms to a side surface of the charge storage film.

8. The nonvolatile memory device of claim 7, wherein a width of the conductive pattern is greater than a width of the insulating pattern.

9. A semiconductor device, comprising:
   an electrode structure including an alternating pattern of gate electrodes and insulating layers;
   an insulating pattern extending through the electrode structure;
   a charge storage film between the electrode structure and the insulating pattern; and
   a protective film between the electrode structure and the charge storage film, wherein the electrode structure has a first length and the protective film has a second length less than the first length, wherein the protection film overlaps at least two of the gate electrodes of the electrode structure.

10. The semiconductor device as claimed in claim 9, wherein the insulating pattern has a third length which is less than the second length.

11. The semiconductor device as claimed in claim 10, wherein:
   a distance between a lower surface of the electrode structure and an upper surface of an uppermost gate electrode is a fourth length, and
   the fourth length is less than the first length, the second length, and the third length.

12. The semiconductor device as claimed in claim 9, further comprising:
   a conductive pattern between a bit line and an upper surface of the insulating pattern, wherein the protective film at least partially overlaps the conductive pattern.

13. The semiconductor device as claimed in claim 12, wherein the charge storage film at least partially extends between an upper surface of the protective film and an upper surface of the electrode structure.

* * * * *